United States Patent
Kim et al.

(10) Patent No.: US 10,105,937 B2
(45) Date of Patent: Oct. 23, 2018

(54) VACUUM RING FOR PRODUCING LAMINATED ASSEMBLY AND METHOD FOR PRODUCING LAMINATED ASSEMBLY USING THE SAME

(71) Applicant: Hyundai Motor Company, Seoul (KR)

(72) Inventors: Sol Kim, Suwon-si (KR); Moon Jung Eo, Suwon-si (KR); Sang Hak Kim, Seoul (KR); Won Jung Kim, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 460 days.

(21) Appl. No.: 14/932,616

(22) Filed: Nov. 4, 2015

(65) Prior Publication Data

US 2016/0229167 A1 Aug. 11, 2016

(30) Foreign Application Priority Data

Feb. 9, 2015 (KR) ........................ 10-2015-0019261

(51) Int. Cl.
*B32B 37/00* (2006.01)
*H01L 31/00* (2006.01)
(Continued)

(52) U.S. Cl.
CPC ........ *B32B 37/0046* (2013.01); *B32B 37/003* (2013.01); *H01L 31/048* (2013.01);
(Continued)

(58) Field of Classification Search
CPC ..... B32B 37/00; B32B 37/004; B32B 37/004; B32B 37/0046; B32B 37/003;
(Continued)

(56) References Cited

U.S. PATENT DOCUMENTS

| 2,948,645 | A | * | 8/1960 | Keim | ................ | B32B 17/10036 |
| | | | | | | 156/104 |
| 3,933,552 | A | * | 1/1976 | Shumaker | ......... | B32B 17/10036 |
| | | | | | | 156/104 |
| 4,781,783 | A | * | 11/1988 | Ash | .................. | B32B 17/10045 |
| | | | | | | 156/104 |

FOREIGN PATENT DOCUMENTS

| JP | 2000-335623 | 12/2000 |
| KR | 10-1993-0011145 | 11/1993 |

(Continued)

*Primary Examiner* — Jacob T Minskey
*Assistant Examiner* — Matthew Hoover
(74) *Attorney, Agent, or Firm* — Brinks Gilson & Lione

(57) ABSTRACT

The present disclosure provides a vacuum ring for removing bubbles of a laminated assembly and a method for bonding the laminated assembly using the same. The vacuum ring includes an indented portion receiving a laminated assembly to be sealed, and an inner space of the indented portion is in communication with a vacuum source to remove the bubbles. The vacuum ring also includes projection members that are projected inside on the bottom of the indented portion at positions where the projection members are spaced upward from a lower end of the indented portion to receive the laminated assembly, and the projections members are spaced downward from the upper end of the indented portion. Further, the laminated assembly is produced by using the vacuum ring to achieve effective exhaustion by using an aperture formed between side ends of the projection members and the bonding cover.

7 Claims, 6 Drawing Sheets

(51) Int. Cl.
  *H01L 31/18* (2006.01)
  *H01L 31/048* (2014.01)
  *B32B 37/18* (2006.01)

(52) U.S. Cl.
  CPC .............. *H01L 31/18* (2013.01); *B32B 37/18* (2013.01); *B32B 2315/08* (2013.01); *B32B 2457/12* (2013.01); *Y02E 10/50* (2013.01)

(58) Field of Classification Search
  CPC ......... H01L 31/00; H01L 31/04; H01L 31/04; H01L 31/048; H01L 31/10; H01L 31/18
  See application file for complete search history.

(56) References Cited

FOREIGN PATENT DOCUMENTS

| | | |
|---|---|---|
| KR | 10-0711566 | 4/2007 |
| KR | 10-2008-0021029 | 3/2008 |
| KR | 10-0905101 | 4/2009 |
| KR | 10-2014-0075871 | 6/2014 |
| KR | 10-2014-0075871 | 10/2014 |

\* cited by examiner

VACUUM RING FOR PRODUCING LAMINATED ASSEMBLY AND METHOD FOR PRODUCING LAMINATED ASSEMBLY USING THE SAME

CROSS-REFERENCE TO RELATED APPLICATION

This application claims the benefit of Korean Patent Application No. 10-2015-0019261, filed on Feb. 9, 2015, which is hereby incorporated by reference in its entirety.

FIELD

The present disclosure relates to a vacuum ring for removing bubbles of an enhanced laminated assembly and a method for bonding the laminated assembly using the same to a vacuum ring enhanced to form an exhaust path between a bonding cover and a substrate.

BACKGROUND

The statements in this section merely provide background information related to the present disclosure and may not constitute prior art.

In general, at the time of producing products such as a solar battery panel assembly in which a solar battery module is deployed on tempered glass for construction and a vehicle in which two sheets or more of glass is bonded in a lamination type and/or a film is vacuum-bonded thereto, and a vehicle sunroof in which the solar battery module is deployed, it is desired to prevent bubbles from being present among respective layers for improving the quality of the product.

To this end, laminated glasses and/or elements to be assembled and a bonding film are deployed at laminated assembly corner portions to be sealed to remove internal air by using a vacuum pump, and as a result, a vacuum ring that removes bubbles which may be present among respective layers of a laminated assembly has been widely used.

As an example of producing the laminated assembly using the vacuum ring, Korean Patent Publication No. 1993-0011145 (published on Nov. 24, 1993) discloses a method for producing a damage prevention glass assembly in which for example, a vacuum ring 36 made of silicon or neoprene, which is connected to a vacuum source through a hose 37 is deployed at a periphery of a glass assembly having a thin layer shape, air in the assembly is extracted, the assembly is laid on an auto clave unit designed to apply pressure onto an external surface, a plastic internal layer 16 is bonded to a pair of glass plates 12 on a cover plate 30, the glass assembly having the thin layer shape in overall is heated at a predetermined temperature so that a PVB layer of a damage preventing plate 18 is bonded onto the surface of a glass plate 14. Typically, pressure in an auto clave is in the range of approximately 200 to 275 psi and a temperature is in the range of approximately 250 to 325° F. and the temperature and the pressure are maintained for approximately 20 to 30 minutes in order to provide effective bonding among respective thin layers.

As another example of bonding the laminated assembly by using the vacuum ring, provided are a lamination glass pressing method disclosed in U.S. Pat. No. 2,948,645 (Aug. 9, 1960), a transparent lamination glass pressing method disclosed in U.S. Pat. No. 3,933,552 (Jan. 20, 1976), and a solar battery module for a sunroof and a producing method thereof disclosed in Korean Patent Registration No. 10-1451142 (Oct. 8, 2014).

However, in producing the sunroof in which multilayer using the vacuum ring or for example, when the solar battery modules are laminated, the bonding film is deployed between the substrate and an element, a cover member is deployed thereon, and the vacuum rings are deployed at corner portions to remove air, in the case where an end of a cover member contacts the top of the substrate before the bubbles are sufficiently removed in an empty space between the element and/or the bonding film and the substrate, the bubbles are not completely removed in the case where for example, the bonding film is heated to be melted and bonded in the auto clave while the inner space is isolated.

In particular, when a lot of laminated objects are laid on the substrate or a flexible film type bonding cover is used, in the case where the bonding cover contacts the substrate before the bubbles are completely removed to form a sealed space, the problem frequently occurs when the bonding film is melted while the bubbles are confined and the problem occurs more frequently particularly when curved glass is used as the substrate.

Therefore, improvements are required, which enable the bubbles to be removed by the vacuum ring before a heating bonding process in the auto clave starts.

SUMMARY

The present disclosure provides a vacuum ring in which a plurality of projection members are provided inside so as to form a flow path to effectively exhaust trapped air between a substrate and at least a bonding cover and among respective layers of a laminated assembly.

The present disclosure also provides a method for bonding a lamination glass panel by using an enhanced vacuum ring so as to form an exhaust path between the substrate and a cover member.

In one aspect of the present disclosure, a vacuum ring in which an indented portion is formed so that the upper and lower ends of the indented portion contact the top and the bottom surfaces of a laminated assembly to be sealed, respectively, and an inner space formed by the upper and lower ends of the indented portion fits in a corner portion of the laminated assembly. The inner space is in communication with a vacuum source to remove bubbles which are present among respective layers of the laminated assembly and the vacuum ring. The vacuum ring includes a plurality of projection members that are projected inside from the bottom portion of the indented portion at positions where the projection members are spaced upward from the lower end of the indented portion as far as a distance corresponding to the thickness of the laminated assembly and spaced downward from the upper end of the indented portion at a deployment interval.

In one embodiment, sides of the respective projection members may have a size to form an empty aperture which is in communication with an empty space between the bottom of the indented portion and the end of the laminated assembly, and between the bonding covers and the projection members.

In another embodiment, the projection members may be formed integrally with the bottom of the indented portion of the vacuum ring.

In still another embodiment, the projection members may be selected from a quadrangular pole or a rectangular plate member and an upper side of the projection member may be larger than a lower side so that the aperture is formed to be larger between the bonding cover deployed on the projection members and the side of the projection member.

In yet another embodiment, the projection members may be assembled to grooves formed on the bottom of the indented portion of the vacuum ring as a separate member.

In another aspect, the present disclosure provides a method for bonding a laminated assembly using a vacuum ring, including: producing a laminated assembly formed by laminating solar battery modules or other bonding glass onto a substrate by using at least one adhesive film; deploying a bonding cover on the top of the laminated assembly and deploying the top and the bottom of the vacuum ring of which the inside is connected with a vacuum resource on the top of corner portions of the bonding cover and the bottom of the laminated assembly to be sealed, respectively to achieve exhaustion; and closely attaching the laminated assembly and the bonding cover deployed on the top thereof at predetermined pressure and heating the laminated assembly and the bonding cover at a predetermined temperature to fuse and integrate the bonding cover onto the laminated assembly.

In one embodiment, the bonding cover may be deployed on a plurality of projection members that are projected to the inside from the bottom of an indented portion of the vacuum ring to remove air between the laminated assembly and the bonding cover by using an aperture formed between the bonding cover and side ends of the respective projection members as a path, thereby preventing bubbles from being formed.

According to the present disclosure, a vacuum ring can achieve effective exhaustion with an aperture formed between side ends of projection members and a bonding cover as an exhaust path by forming the plurality of projection members that are projected inside on the bottom of an indented portion and deploying the bonding cover of a laminated assembly on the projection members, and as a result, a laminated assembly having improved quality can be acquired because bubble is rarely generated between the laminated assembly and the bonding cover and among respective layers of the laminated assembly.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
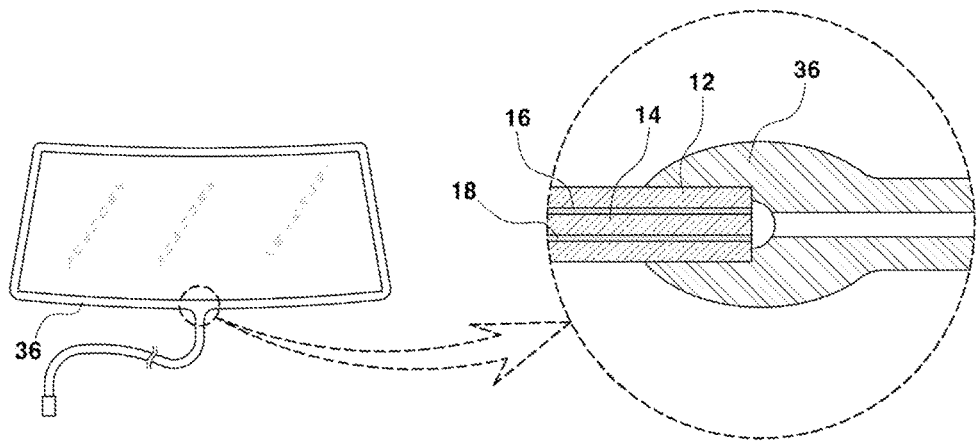
FIG. 1 is a diagram schematically illustrating that a vacuum ring in the related art and a lamination glass panel assembly using the same.

It should be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes will be determined in part by the particular intended application and use environment.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure is intended to cover not only the exemplary embodiments, but also various alternatives, modifications, equivalents and other embodiments, which may be included within the spirit and scope of the present disclosure as defined by the appended claims.

Figure 2:
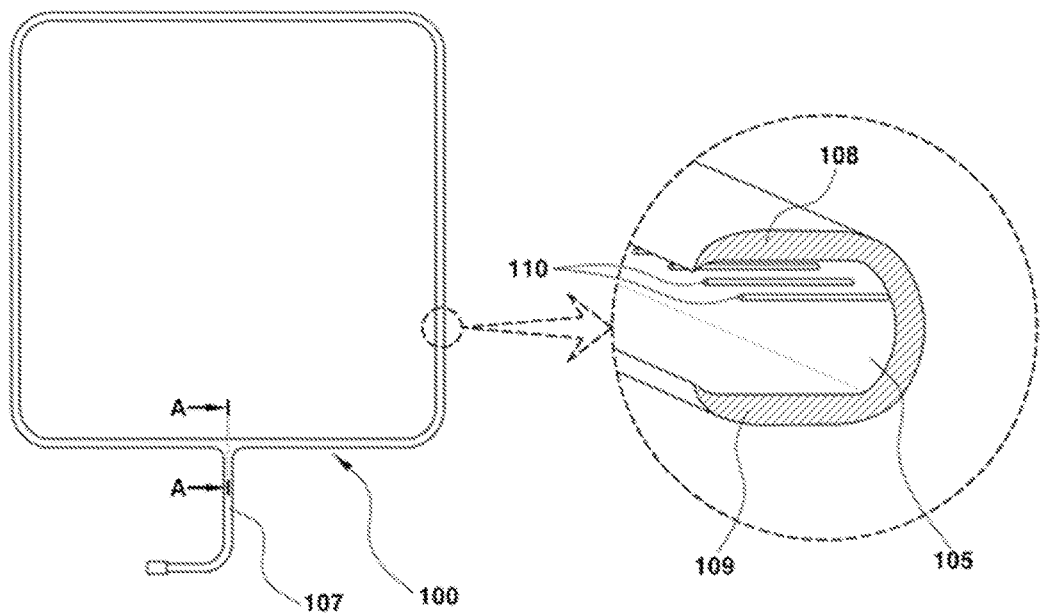
FIG. 2 is a schematic perspective view of a vacuum ring having an enhanced structure according to the present disclosure.
Figure 3:
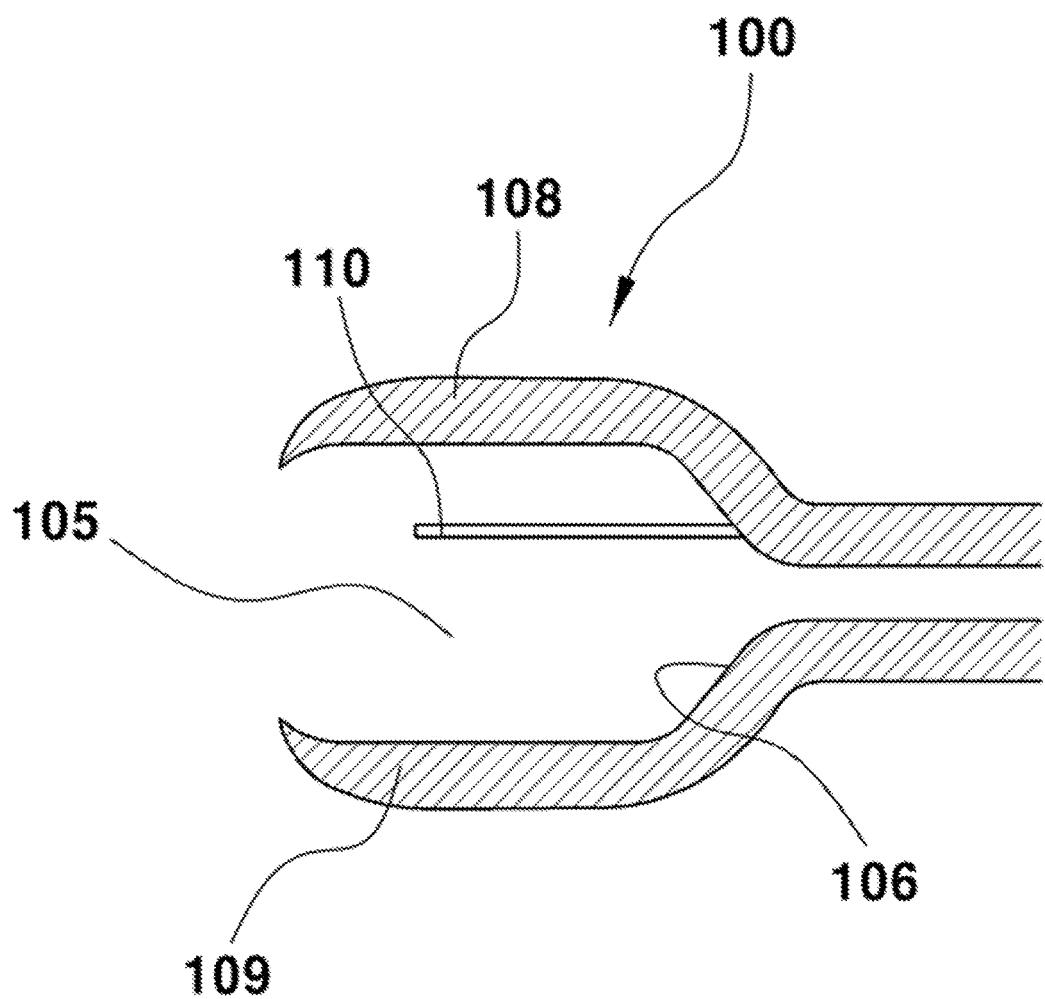
FIG. 3 is a cross-sectional view of the vacuum ring taken along line A-A of FIG. 2.

In FIGS. 2 and 3, a vacuum ring 100 according to the present disclosure has an indented portion 105, in one form having a concave shape, for example, a "C"-shaped cross section, and the indented portion 105 is formed inside the vacuum ring 100. A plurality of projection members 110 are projected inside from a bottom 106 and spaced from the lower end 109 of the indented portion 105 by a predetermined distance, for example, a substrate thickness of a laminated assembly. The plurality of projection members 110 are spaced apart from the upper end 108 of the indented portion as far as the thickness of a bonding cover of the laminated assembly. The upper and the lower end 108, 109 of the indented portion 105 are arranged to contact and seal the top and the bottom surfaces of the laminated assembly. The bonding cover is formed by a flexible film.

A space formed by the indented portion of the vacuum ring is connected to a vacuum pump (not illustrated) through a hose 107, and as a result, an empty space between an end of the laminated assembly and the indented portion of the vacuum ring may be exhausted. Upper and lower ends 108 and 109 of the indented portion of the vacuum ring may be designed with an appropriate size considering a degree of elasticity to elastically engage in laminates to be bonded and a corner of the bonding cover deployed thereon to be sealed.

Figure 4:
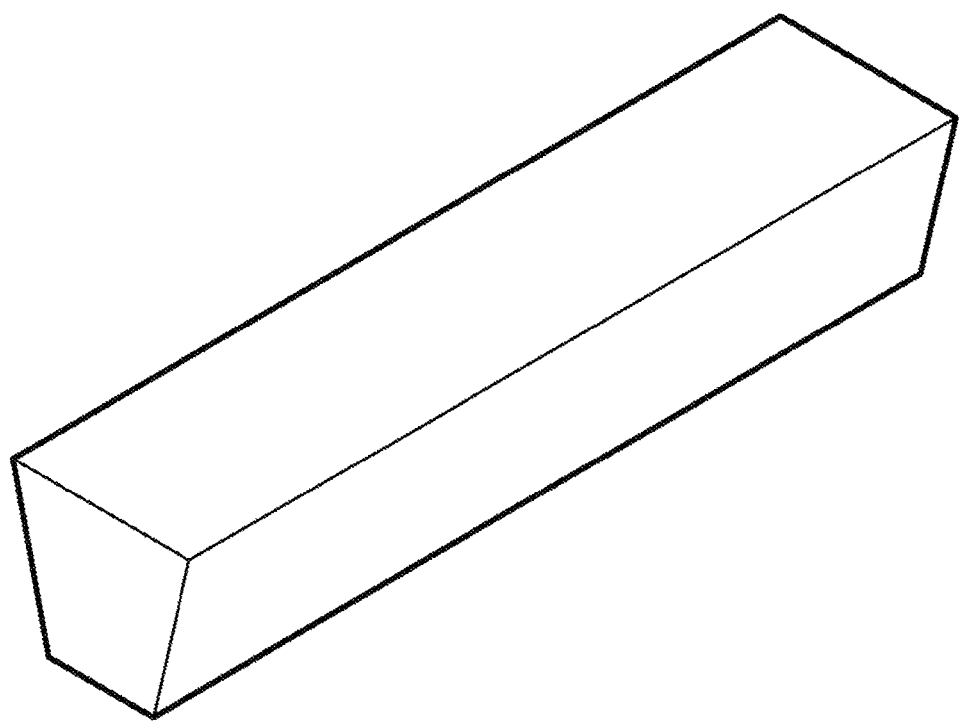
FIGS. 4 to 6 illustrate modified examples of projection members provided inside an indented portion of the vacuum ring.
Figure 5:
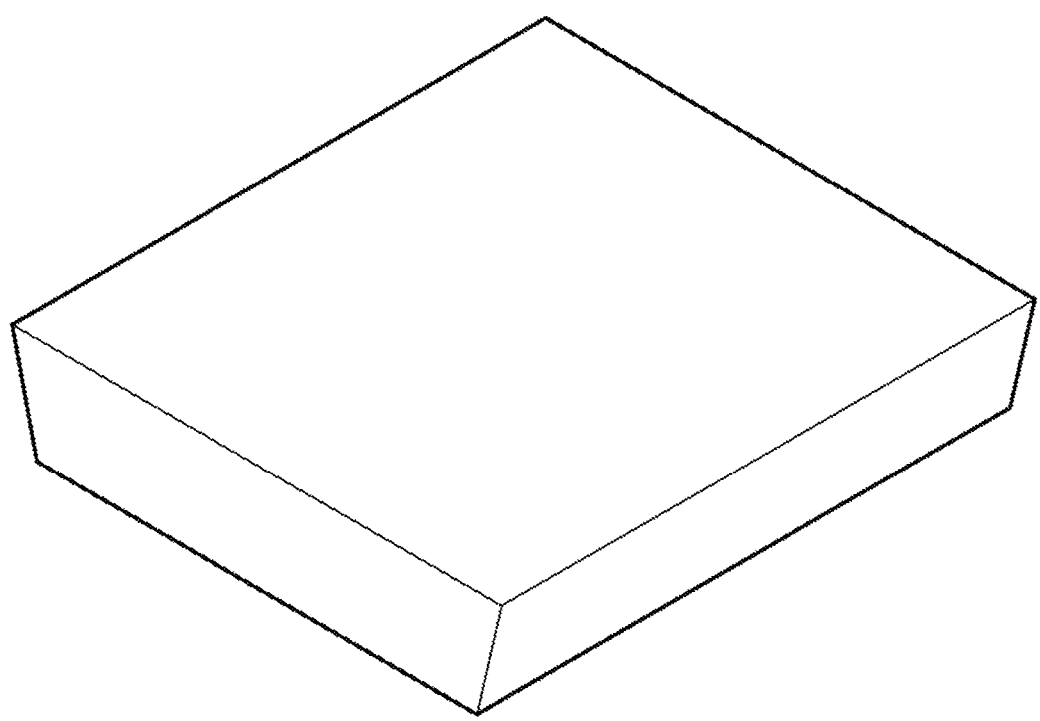

The projection members 110 formed to be projected on the bottom of the indented portion may have a circular cross section as illustrated in FIG. 3, a quadrangular shape as illustrated in FIG. 4, or a rectangular plate member as illustrated in FIG. 5 and sides of the respective projection members need to have a size in which an empty aperture as a path which is in communication with an empty space between the bottom of the indented portion and the end of the laminated assembly and/or between the bonding cover deployed on the projection members. As one example, in the projection members illustrated in FIGS. 4 and 5, when a lower side has a smaller width than an upper side, and as a result, when the bonding cover is deployed on the projection members, the aperture may be formed between the bonding cover and side ends of the projection members to be large as possible.

Further, the vacuum ring 100 may be typically made of heat-resistant silicon or neoprene and the projection members 110 provided on the bottom 106 of the indented portion may be formed integrally with the vacuum ring or separately produced by different materials to be assembled to the bottom of the indented portion.

Figure 6:
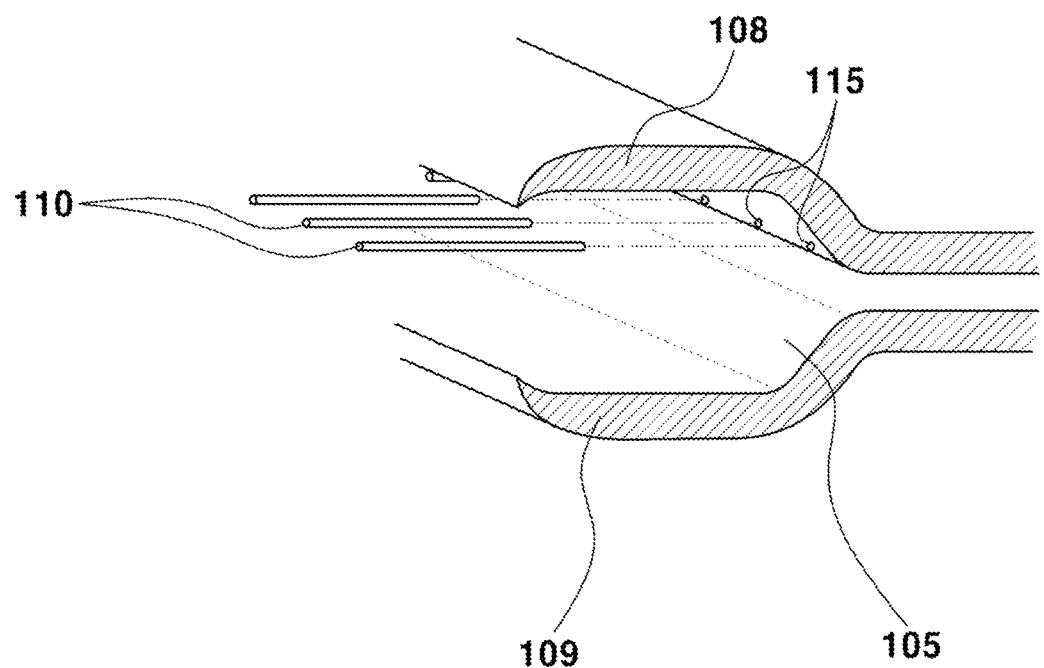

That is, as illustrated in FIG. 6, in the projection members 110, grooves 115 formed on the bottom of the indented portion of the vacuum ring may be formed at a predetermined interval, and the projection members 110 engage in the grooves 115 or multiple projection members are formed and produced in a plate-shaped member and thereafter, the plate-shaped member may be bonded and assembled onto the bottom of the indented portion.

Further, the vacuum ring of the present disclosure may be formed as an integrated type that matches a contour shape of a laminated body to be assembled as described in the embodiments, but when the laminated body to be assembled has a quadrangular shape, the vacuum ring may be constituted by four members to fit in respective sides.

Figure 7:
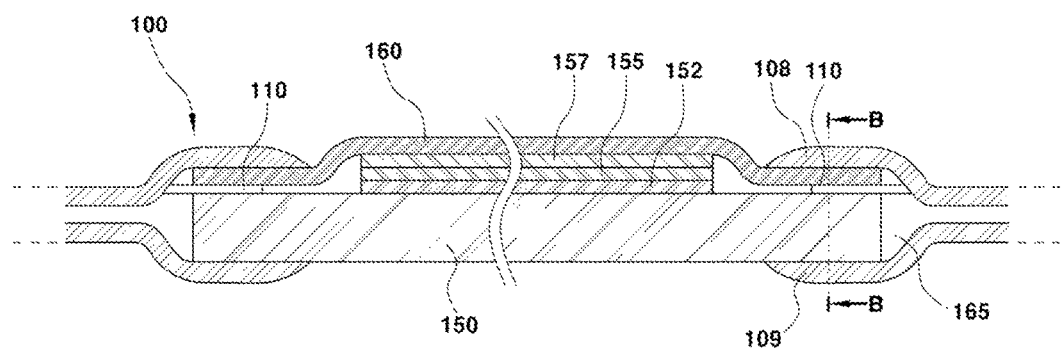
FIG. 7 is a partial perspective view schematically illustrating removal of bubbles when a sunroof in which solar battery modules are laminated is bonded to a glass substrate by using the vacuum ring of FIG. 2.
Figure 8:
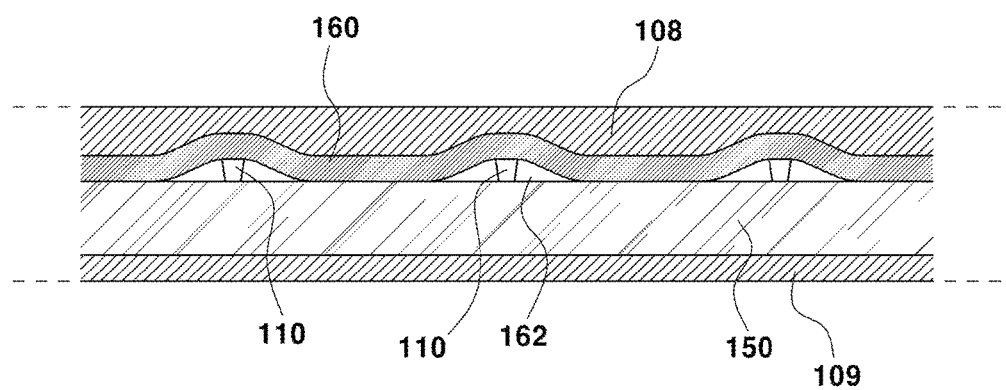
FIG. 8 is a cross-sectional view taken along line B-B of FIG. 7.

Removal of bubbles when a sunroof in which solar battery modules are laminated on a glass substrate is bonded by using the vacuum ring according to the present disclosure will be described with reference to FIG. 7.

For example, when the sunroof in which the solar battery modules are laminated on a substrate 150 made of glass is produced, an adhesion film 152 is attached onto the substrate 150, a solar battery module layer 155 is deployed thereon, and a protective film 157 adheres to produce the laminated assembly. In the illustrated example, it is illustrated that the laminated assemblies are formed by three layers, but it may be easily appreciated that more bonding layers may be formed.

In a sunroof assembly as the assembled laminated assembly, the vacuum ring according to the present disclosure fits in corner portions of the sunroof assembly and the projection members of the vacuum ring are deployed on an exposed outer periphery of the substrate and thereafter, a bonding cover 160 is finally deployed so as to cover an exposed periphery of the substrate bonding layers laminated on the substrate in overall. However, portions laminated on the substrate extend to corners of the substrate, and as a result, when there is no exposed corner portion of the substrate, the bonding cover is deployed on the top of the laminated assembly.

In this case, the corner portions of the bonding cover 160 are deployed on the projection members of the vacuum ring, and as a result, an aperture 162 as an exhaust path is generated between sides of the projection members and the bonding cover as illustrated by an enlarged portion and the aperture is in communication with an empty space 165 between the substrate and an end of a bonding layer and the boding cover.

As generally performed in such a state, air in the vacuum ring is removed by the vacuum pump and in this case, air in the empty space is smoothly discharged through the aperture to sufficiently remove the bubbles among the respective layers of the laminated assembly.

Therefore, the end of the flexible bonding cover deployed on the laminated assembly in the related art first contacts the top of the corner portion of the substrate to be fused while the air is trapped inside the bonding cover end, and as a result, a problem in which the bubbles may not be sufficiently removed is solved even though the inside of the vacuum ring is evacuated.

As such, the substrate on which the bubbles are removed by forming the vacuum ring at the corner portion and the laminated assembly laminated thereon are subjected to an adhesion process, for example, in the auto clave unit at predetermined pressure and temperature by a general method, and as a result, the substrate and adhesive layers and module layers laminated thereon, and the bonding cover are integrated by fusion.

Then, the vacuum ring is separated and the bonding cover is removed, and as a result, a vehicular sunroof assembly in which the solar battery modules are laminated is finally completed.

The method for producing the laminated assembly has been described by using the embodiment associated with the producing of the vehicular sunroof in which the solar battery modules are formed, but it can be easily appreciated by those skilled in the art that the method may be used to produce other types of laminated assemblies such as complex vacuum window glass for construction or other complex glass by using the vacuum ring of the present disclosure.

The present disclosure may be used to effectively remove the bubbles which may be formed among the respective layers of the assembly by evacuation of the inside of the vacuum ring through being coupled with the assembly corner portions when producing the sunroof in which the solar battery modules are laminated or an assembly of multiple layers of bonding layers on the substrate, such as a multilayered glass panel assembly by the bonding layer.

The present disclosure has been described in detail with reference to preferred embodiments thereof. However, it will be appreciated by those skilled in the art that changes may be made in these embodiments without departing from the principles and spirit of the present disclosure, the scope of which is defined in the appended claims and their equivalents.

What is claimed is:

1. A vacuum ring comprising an indented portion formed inside the vacuum ring, a laminated assembly inserted into an inner space formed by upper and lower ends of the indented portion, and the inner space of the indented portion being in communication with a vacuum source to remove bubbles which are present between the indented portion and the laminated assembly,
wherein the vacuum ring further comprises:
a plurality of projection members that are positioned inside the indented portion along a bottom of the indented portion with intervals,
wherein the projection members are spaced upward from the lower end of the indented portion by a predetermined distance corresponding to the thickness of the laminated assembly, and the projection members are spaced apart downward from the upper end of the indented portion by a predetermined distance.

2. The vacuum ring according to claim 1, wherein the predetermined distance between the projection members and the upper end corresponds to a thickness of a bonding cover arranged on the laminated assembly.

3. The vacuum ring according to claim 1, wherein sides of the respective projection members have a size to form an empty aperture which is in communication with an empty space between the bottom of the indented portion and an end of the laminated assembly, and between bonding covers and the projection members.

4. The vacuum ring according to claim 3, wherein the projection members are integrated with the bottom of the indented portion of the vacuum ring.

5. The vacuum ring according to claim 3, wherein the projection members are selected from a quadrangular pole or a rectangular plate member.

6. The vacuum ring according to claim 5, wherein an upper side of each projection member is larger than a lower side of the projection member so that the aperture is enlarged between the side of the projection member and the bonding covers deployed on the projection members.

7. The vacuum ring according to claim 3, wherein the projection members are assembled to grooves formed on the bottom of the indented portion of the vacuum ring.

\* \* \* \* \*